(12) United States Patent
Tsunashima et al.

(10) Patent No.: US 6,326,658 B1
(45) Date of Patent: Dec. 4, 2001

(54) SEMICONDUCTOR DEVICE INCLUDING AN INTERFACE LAYER CONTAINING CHLORINE

(75) Inventors: Yoshitaka Tsunashima; Katsuya Okumura; Masayuki Tanaka; Shigehiko Saida, all of Yokohama; Hirofumi Inoue, Yokkaichi; Takeshi Hamamoto, Yokohama, all of (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/404,594

(22) Filed: Sep. 24, 1999

(30) Foreign Application Priority Data

Sep. 25, 1998 (JP) ................................. 10-271295
Sep. 20, 1999 (JP) ................................. 11-265551

(51) Int. Cl.$^7$ .................... H01L 27/108; H01L 29/76; H01L 29/94; H01L 31/119
(52) U.S. Cl. ........................... 257/301; 257/302
(58) Field of Search ................... 257/295–310; 438/243–253

(56) References Cited

U.S. PATENT DOCUMENTS

| 5,486,706 | * | 1/1996 | Yuki et al. .............................. 257/25 |
| 5,543,348 | | 8/1996 | Hammerl et al. . |
| 5,670,805 | | 9/1997 | Hammerl et al. . |
| 5,827,765 | | 10/1998 | Stengl et al. . |
| 5,905,279 | | 5/1999 | Nitayama et al. . |
| 6,140,675 | * | 10/2000 | Sugiura et al. ...................... 257/301 |

* cited by examiner

Primary Examiner—Tom Thomas
Assistant Examiner—Cuong Quang Nguyen
(74) Attorney, Agent, or Firm—Finnegan, Henderson, Farabow, Garrett & Dunner, L.L.P.

(57) ABSTRACT

A buried strap is formed after forming an SiC layer on the side surface of a trench in order to suppress the epitaxial growth of Si from the side surface (single crystal Si) of the trench to the buried strap (polycrystalline Si) without causing an increase in the contact resistance in the post process accompanied by high temperature after formation of the buried strap.

2 Claims, 8 Drawing Sheets

SEMICONDUCTOR DEVICE INCLUDING AN INTERFACE LAYER CONTAINING CHLORINE

BACKGROUND OF THE INVENTION

The element area of a semiconductor integrated circuit is gradually reduced for each generation with an increase in the integration density and miniaturization of the semiconductor integrated circuit as is represented by a DRAM. In a DRAM in which each memory cell is formed of one transistor and one capacitor, a reduction in the element area causes a reduction in the area of the capacitor for storing information so that the information storing function may be deteriorated.

Therefore, various devices are made to securely attain a sufficiently large capacitance of the capacitor so as to prevent the information storing function from being deteriorated by the high integration density and miniaturization in the DRAM. One of the devices is to form the capacitor in the 3-dimensional form, that is, use a trench capacitor or stacked capacitor.

As the trench capacitor, a structure called a substrate plate type is mainly used for the DRAM of 64 Mbit or more. The important point in the memory cell using the substrate plate type trench capacitor is the structure of a connecting portion between the storage node electrode (the electrode buried in the trench) of the capacitor and the source/drain diffusion layer of the transistor.

Figure 8:
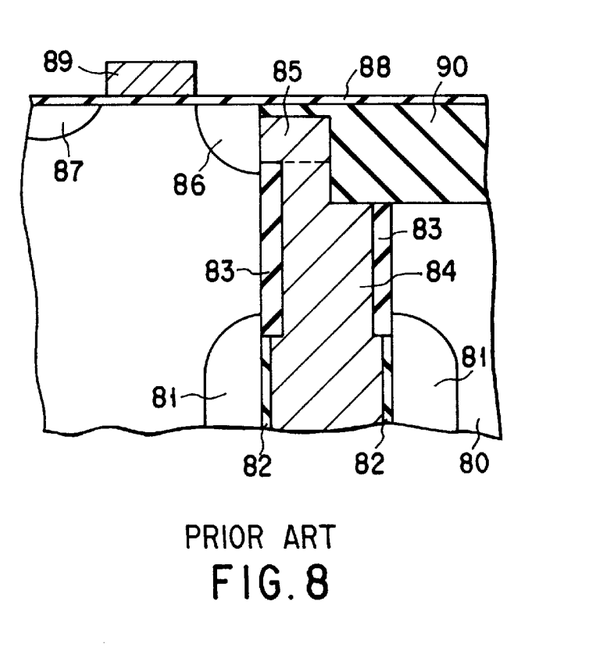
FIG. 8 is a cross sectional view showing the conventional DRAM memory cell having the buried strap structure.

As one of the structures of the connecting portions, a buried strap structure is known. FIG. 8 is a cross sectional view showing a DRAM memory cell having the buried strap structure. In FIG. 8, a reference numeral 80 denotes a single crystal silicon substrate, 81 a plate electrode, 82 a capacitor insulating film, 83 a collar oxide film, $84_1$, $84_2$ storage node electrodes, 85 a buried strap (polysilicon film), 86, 87 source/drain diffusion layers, 88 a gate insulating film, 89 a gate electrode and 90 an element isolation insulating film for STI (Shallow Trench isolation).

In this type of memory cell, the electrical connection between the source/drain diffusion layer 86 and the storage node electrode 86 is attained by use of the buried trap 85. The buried strap 85 has an advantage that it can be formed in a self-alignment manner without using the photolithography process using a mask. Further, it also has an advantage that the area is not increased by formation of the buried strap 85.

In the above type of memory cell, the following problem on the process occurred.

In a case where an oxide film such as a natural oxide film is not formed on the interface between the buried strap 85 and the single crystal silicon substrate 80 in an area used as the source/drain diffusion layer 86, that is, when the interface is extremely clean, the epitaxial growth occurs from the side surface of the trench towards the buried strap 85 in the post process of high temperature, for example, in the formation process of the element isolation insulating film 90.

Figure 9:
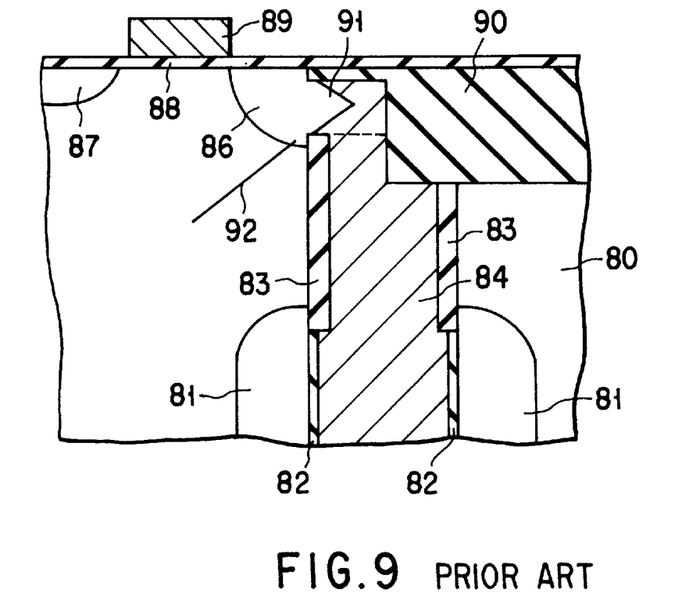
FIG. 9 is a cross sectional view for illustrating the problem of the conventional DRAM memory cell having the buried strap structure.

More specifically, as shown in FIG. 9, a wedge-shaped epitaxial region 91 is formed in the buried strap 85. As a result, local mechanical stress occurs and transfer 92 occurs in the substrate. The transfer 92 causes an increase in the junction leak current, thereby deteriorating the data holding characteristic of the DRAM.

BRIEF SUMMARY OF THE INVENTION

Figure 10:
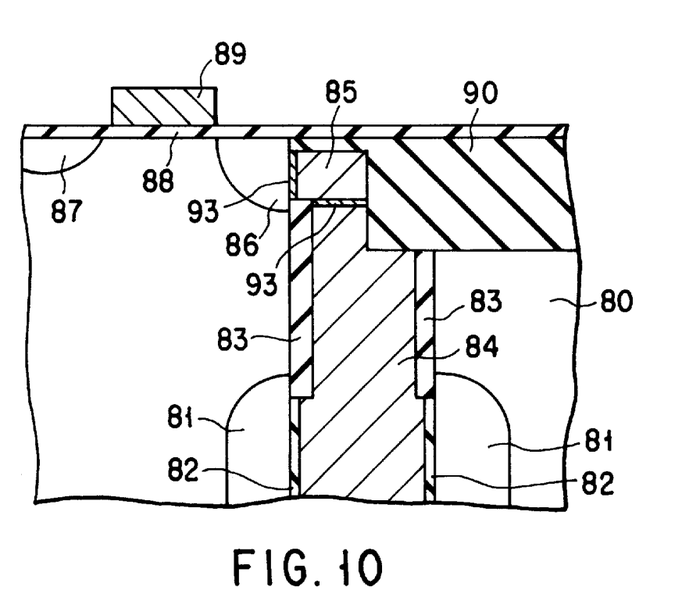
FIG. 10 is a cross sectional view showing a MOS transistor capable of suppressing the epitaxial growth.

The inventors of this application and others considered to suppress the epitaxial growth by forming an oxide film or nitride film 93 on the interface as shown in FIG. 10 so as to solve the above problem.

Since the oxide film or nitride film 93 is an insulating film, it is necessary to precisely control the film thickness thereof to an extremely small value.

However, since the control process is difficult, the contact resistance between the buried strap 85 and the source/drain diffusion layer 86 may become large or a variation in the contact resistance between the memory cells becomes large if an oxide film or nitride film 93 is formed on the interface. This causes a variation in the data readout characteristic and gives a bad influence on the device.

An object of this invention is to provide a semiconductor device having a structure in which a polycrystalline semiconductor film is formed on a single crystal semiconductor substrate and capable of preventing occurrence of transfer during the above process and an increase in the contact resistance and a method for manufacturing the same.

A semiconductor device according to an embodiment of this invention comprises a single crystal semiconductor substrate; a polycrystalline semiconductor film formed on the single crystal semiconductor substrate; and a conductive interface layer formed between the single crystal semiconductor substrate and the polycrystalline semiconductor film and formed of a material different from constituent materials of the single crystal semiconductor substrate and the polycrystalline semiconductor film.

Further, a method for manufacturing a semiconductor device according to this invention comprises the steps of forming a conductive interface layer on the surface of a single crystal semiconductor substrate by reacting gas of a material different from a constituent material of the single crystal semiconductor substrate with the single crystal semiconductor substrate; and forming a polycrystalline semiconductor film which is formed of a material different from a constituent material of the interface layer and connected to the single crystal semiconductor substrate by the interface layer. The interface layer may be formed by use of a CVD method using a material different from the constituent material of the single crystal semiconductor substrate as a raw material.

Further, a method for manufacturing a semiconductor device according to this invention comprises the steps of repeatedly adsorbing $SiCl_4$ to a surface of a single-crystal silicon substrate and nitriding the surface of the single-crystal silicon substrate, thereby forming an interface layer of silicon nitride on the surface of the single-crystal silicon substrate; and forming a polycrystalline silicon film connected to the single-crystal silicon substrate by the interface layer.

Preferable aspects of a semiconductor device and a method for manufacturing the semiconductor device according to this invention are as follows. In a case where a single crystal silicon substrate is used as the single crystal semiconductor substrate and a polysilicon film is used as the polycrystalline semiconductor film, a silicon carbide film is used as the interface layer. The film thickness of the silicon carbide film is 10 nm or less.

Further, in a case where the polycrystalline semiconductor layer is formed in a trench, a method for first forming an amorphous semiconductor layer in the trench and then changing the amorphous silicon layer to a polysilicon film by the heat treatment may be used. In this case, since the heat treatment can also be used as the heat treatment effected in the post process, it is not necessary to newly add a heat treatment process for forming the polycrystalline layer and therefore the number of steps is not increased.

According to this invention, since the epitaxial growth from the single crystal semiconductor substrate to the polycrystalline semiconductor film can be suppressed and occurrence of transfer in the substrate can be prevented in the post process of high temperature after formation of the polycrystalline semiconductor film by forming the interface layer between the single crystal semiconductor substrate and the polycrystalline semiconductor film. Further, since the interface layer is conductive, an increase in the contact resistance between the single crystal semiconductor substrate and the polycrystalline semiconductor film can be suppressed.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

There will now be described embodiments of this invention with reference to the accompanying drawings.
(First Embodiment)

Figure 1:
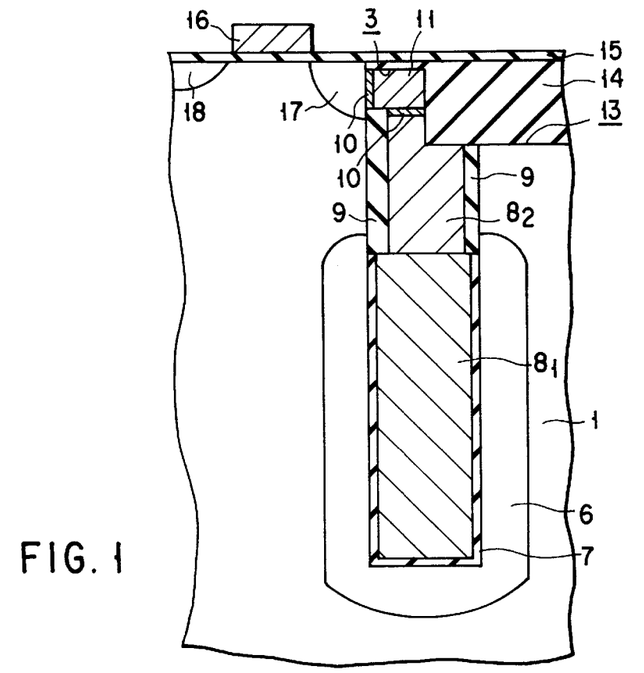
FIG. 1 is a cross sectional view showing a DRAM memory cell according to a first embodiment of this invention.

FIG. 1 is a cross sectional view showing a DRAM memory cell according to a first embodiment of this invention.

The memory cell has a capacitor of buried strap structure and the feature thereof is that an SiC layer 10 is formed as an interface layer between a source/drain diffusion layer 17 and a buried strap 11.

An SiC layer 3 is formed on the interface between the buried strap 11 and a second storage node electrode $8_2$, but it is formed in the course of the process and no problem occurs even if it is not formed.

With the above structure, in the post process accompanied by a high temperature and effected after formation of the buried strap 11, the epitaxial growth from the side surface (single crystal silicon) of the trench 3 to a polycrystalline semiconductor film used as the buried strap 11 can be suppressed by the presence of the SiC layer 10 and occurrence of transfer in the substrate can be prevented. Therefore, a problem of degradation in the data holding characteristic caused by an increase in the junction leak current due to occurrence of transfer will not occur.

Further, since the SiC layer 10 is a conductive layer, an increase in the contact resistance between the side wall of the trench 3 and the second storage node electrode $8_2$ can be suppressed. It is preferable to form the SiC layer 10 with a film thickness 10 nm or less from the viewpoint of effectively suppressing an increase in the contact resistance.

Next, a method for forming the memory cell of this embodiment is explained. FIGS. 2A to 2L are cross sectional views showing the manufacturing steps of the manufacturing method.

Figure 2A:
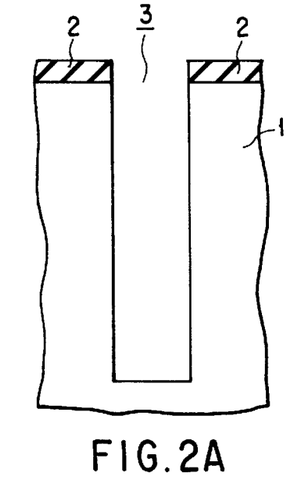
FIGS. 2A to 2L are cross sectional views showing the manufacturing steps of a manufacturing method of the DRAM memory cell of FIG. 1.

As shown in FIG. 2A, first, a mask pattern 2 of three-layered structure of oxide film/silicon nitride film/silicon oxide film is formed on a single crystal silicon substrate 1 and a deep trench 3 is formed by etching the single crystal silicon substrate 1 by the RIE method with the above mask pattern used as a mask.

Figure 2B:
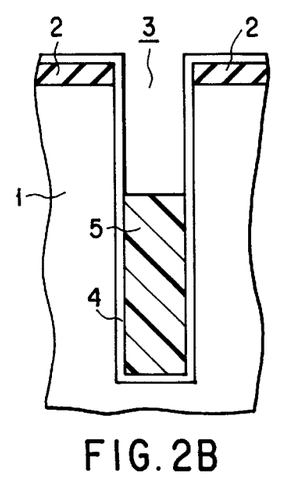

Then, as shown in FIG. 2B, after an impurity doped film 4 is formed to cover the side surface and bottom surface of the trench 3, a photoresist layer 5 is filled in the trench 3 to the intermediate depth thereof.

As the impurity doped film 4, for example, an arsenic glass film is used. Further, the photoresist layer 5 is formed as follows. That is, first, a positive type photoresist is coated on the entire surface, only a portion of the photoresist which lies above the central portion of the trench 3 is exposed to light, and then the photoresist is developed to remove the upper portion of the photoresist so as to form the photoresist layer 5.

Figure 2C:
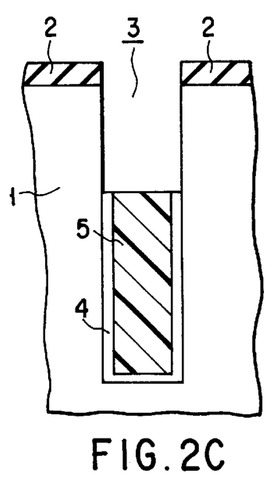

Next, as shown in FIG. 2C, the impurity doped film 4 is etched with the photoresist layer 5 used as a mask to expose the side surface of a portion of the trench 3 which lies above the photoresist layer 5. Then, the photoresist layer 5 is removed.

Figure 2D:
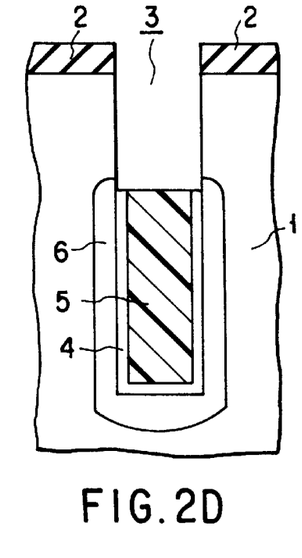

After this, as shown in FIG. 2D, impurity in the impurity doped film 4 is diffused into the substrate to form a plate electrode 6 in the substrate around the impurity doped film 4. Then, the impurity doped film 4 and the photoresist layer 5 are removed.

Figure 2E:
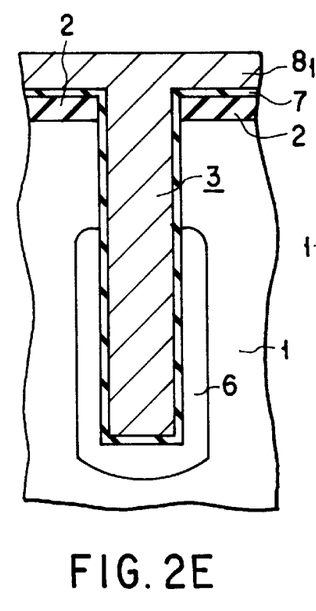

Next, as shown in FIG. 2E, an extremely thin capacitor insulating film 7 formed of a silicon nitride film/silicon oxide film is formed on the entire surface to cover the side surface and bottom surface of the trench 3.

Then, as shown in FIG. 2E, a first n-type polysilicon film $8_1$ with high impurity concentration which is used as a first storage node electrode is formed on the entire surface of the resultant structure to fill the internal portion of the trench 3.

Figure 2F:
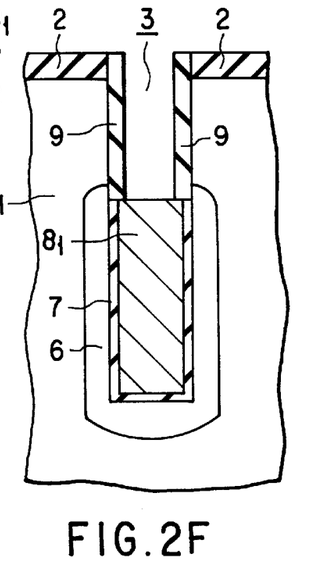

Next, as shown in FIG. 2F, the first n-type polysilicon film $8_1$ is etched back by the RIE method to form the first storage node electrode $8_1$ and then the side surface of a portion of the trench 3 which lies above the first storage node electrode $8_1$ is exposed by etching the capacitor insulating film 7 with the first storage node electrode $8_1$ used as a mask.

After this, as shown in FIG. 2F, a collar oxide film ($SiO_2$ film) 9 is formed by a so-called sidewall leaving process on the side wall of a portion of the trench 3 which lies above the first storage node electrode $8_1$.

Figure 2G:
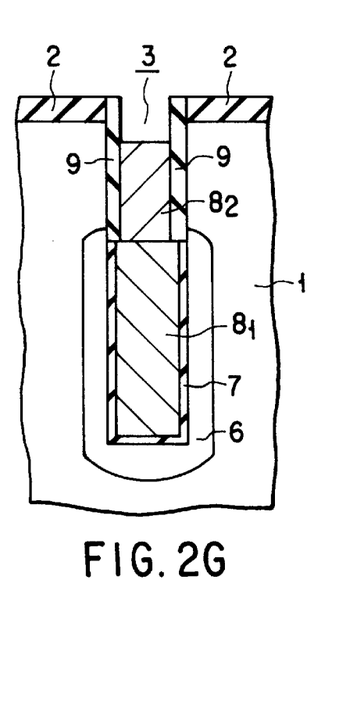

Then, as shown in FIG. 2G, after a second n-type polysilicon film with high impurity concentration is deposited by the LPCVD method to fill the internal portion of the trench 3, the polysilicon film is etched back to form a second storage node electrode $8_2$ formed of the second n-type polysilicon film. At this time, the etch-back process is effected so as to leave behind an unfilled portion on the upper portion of the trench 3.

Figure 2H:
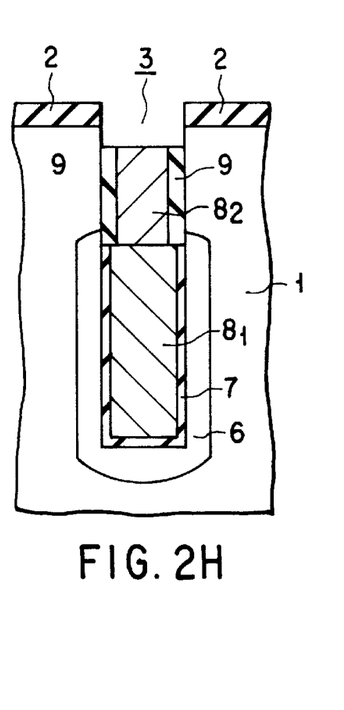

Next, as shown in FIG. 2H, the side surface of a portion of the trench 3 which lies above the second storage node electrode $8_2$ is exposed by etching the collar oxide film 9 with the second storage node electrode $8_2$ used as a mask.

Figure 2I:
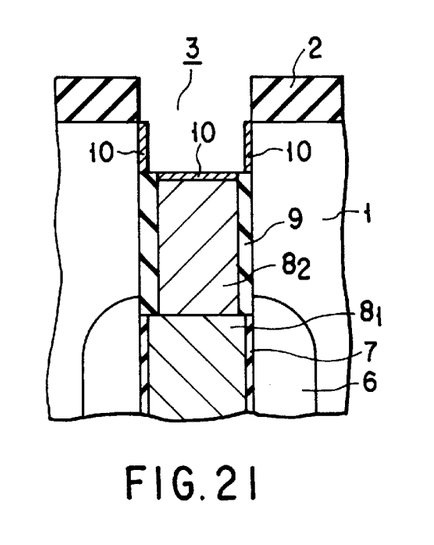

After this, as shown in FIG. 2I, an SiC layer 10 is formed on the surface of the second storage node electrode $8_2$ and the side surface of the trench 3 in an LPCVD device. The film formation condition is that the temperature is set at a high temperature of 750° C. and material gas is gas containing carbon, for example, $C_2H_4$ gas. Thus, the SiC layer 10 can be easily formed on the side wall of the trench 3 by causing $C_2H_4$ gas to react with silicon of the side wall of the trench 3.

Figure 2J:
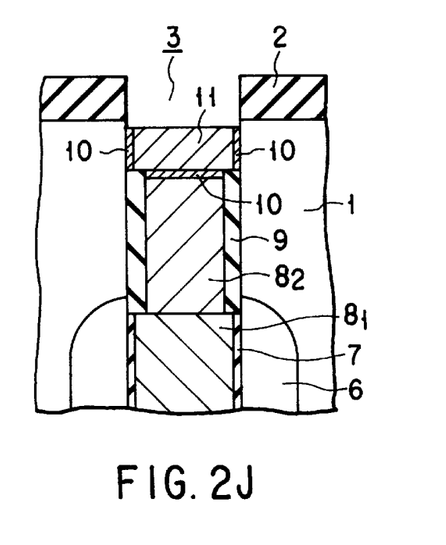

Then, as shown in FIG. 2J, after a polysilicon film which is used as the buried strap 11 is formed on the entire surface of the resultant structure so as to fill the internal portion of the trench 3 in the same LPCVD device, the buried strap 11 is formed by etching back and removing a surplus polysilicon film which lies outside the trench 3. At this time, the polysilicon film and SiC layer 10 are removed to a portion lower than the opening surface of the trench 3 to leave behind a shallow unfilled portion on the upper portion of the trench 3.

In this example, the SiC layer 10 and buried strap 11 are continuously formed with the vacuum condition kept unchanged by use of the same LPCVD device, but they can be formed by use of different LPCVD devices. In this case, it is preferable to move them between the LPCVD devices without exposing them to air.

The buried strap 11 can be formed by filling an amorphous silicon film in the trench 3 by use of an LPCVD device and changing the amorphous silicon film into a polysilicon film in the heat treatment of the post process.

In this case, since the amorphous silicon film can be formed at a film formation temperature of 500° C., the process temperature can be lowered in comparison with a case of the polysilicon film (film formation temperature is 650° C.).

Figure 2K:
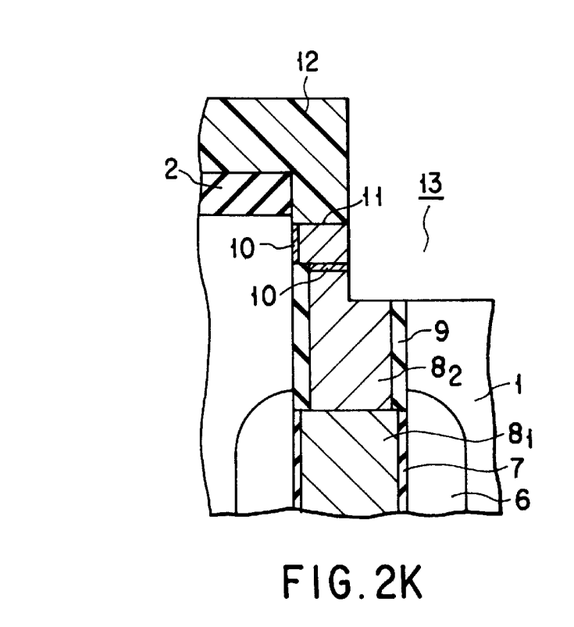

Next, as shown in FIG. 2K, after a resist pattern 12 for forming an element isolation trench is formed, the buried strap 11, SiC layer 10, second storage node electrode $8_2$, collar oxide film 9 and single crystal silicon substrate 1 are etched with the above resist pattern used as a mask by the RIE method to form a shallow trench (element isolation trench) 13. After this, the resist pattern 12 and mask pattern 2 are removed.

Figure 2L:
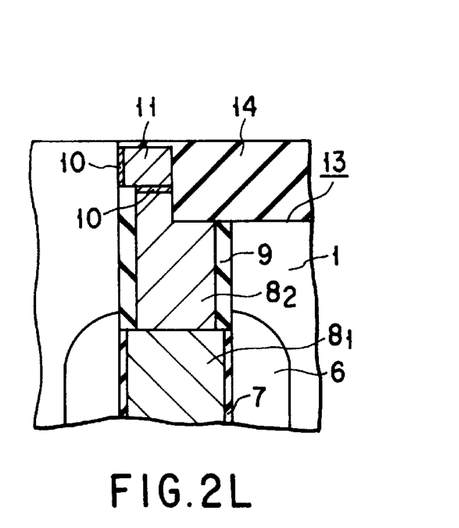

Then, as shown in FIG. 2L, an element isolation insulating film 14 is filled and formed in the element isolation trench 13 by deposition of the insulating film and planarization of the same by CMP.

The process for forming the element isolation insulating film 14 is accompanied by a step of high temperature, but the epitaxial growth from the side surface (single crystal silicon) of the trench 3 to the buried strap (polysilicon film) 11 can be suppressed by the presence of the SiC layer 10 and occurrence of transfer in the substrate can be prevented. Therefore, the data holding characteristic can be prevented from being deteriorated by an increase in the junction leak current due to occurrence of transfer.

Finally, a gate insulating film 15, gate electrode 16 and source/drain diffusion layers 17, 18 are formed by the known method to complete the DRAM memory cell shown in FIG. 1. Although not shown in the drawing, it is preferable to form a shallow diffusion layer (extension) of low impurity concentration in order to suppress the short channel effect.

The process for forming the gate electrode 16 and source/drain diffusion layers 17, 18 is accompanied by the step of high temperature, but like the case of formation of the element isolation insulating film 14, occurrence of transfer in the substrate can be prevented by the presence of the SiC layer 10, and therefore, a lowering in the data holding characteristic due to an increase in the junction leak current can be prevented.

(Second Embodiment)

Figure 3:
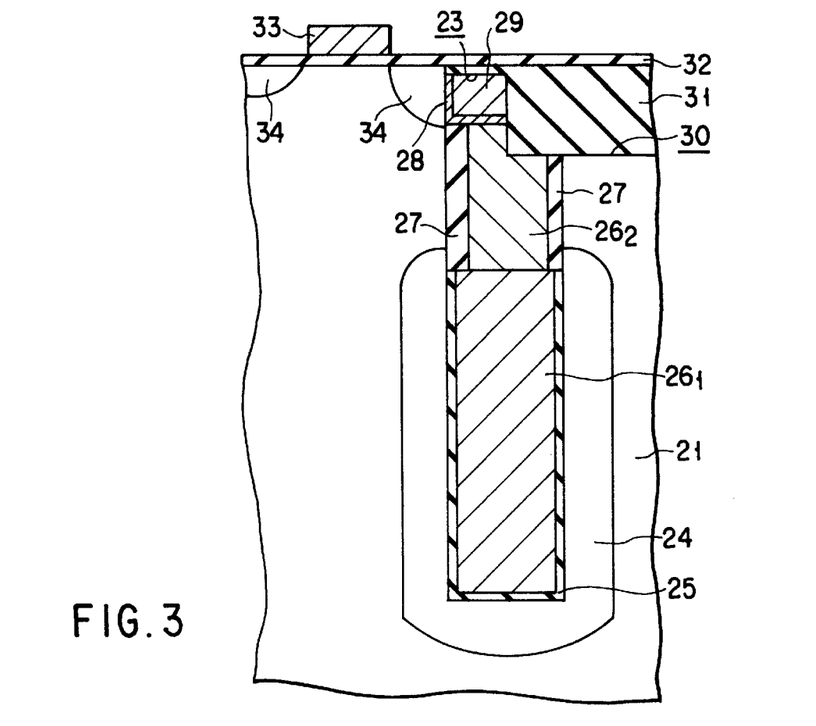
FIG. 3 is a cross sectional view showing a DRAM memory cell according to a second embodiment of this invention.

FIG. 3 is a cross sectional view showing a DRAM memory cell according to a second embodiment of this invention.

The memory cell has a capacitor of buried strap structure and the feature thereof is that a silicon nitride layer 28 containing excessive Si used as an interface layer is formed between a buried strap 29 and a source/drain diffusion layer 34.

Further, a silicon nitride layer 28 containing excessive Si is formed on the interface between the buried strap 29 and a second storage node electrode $26_2$ and on the interface between the buried strap 29 and a collar oxide film 27, but the silicon nitride layer is formed in the course of process and no problem occurs even if it is not formed.

With the above structure, in the post process of high temperature after the buried strap 29 is formed, the epitaxial growth from the side surface (single crystal silicon) of the trench 23 to a polycrystalline semiconductor film used as the buried strap 29 can be suppressed by the presence of the silicon nitride layer 28 containing excessive Si and occurrence of transfer in the substrate can be prevented. Therefore, there occurs no problem that the data holding characteristic is deteriorated by an increase in the junction leak current due to occurrence of transfer.

Further, since the resistance of the silicon nitride layer 28 containing excessive Si is lower than that of a normal silicon nitride layer ($Si_3N_4$ layer), an increase in the contact resistance between the side wall of the trench 23 and the second storage node electrode $26_2$ can be suppressed.

Next, a method for manufacturing a DRAM memory cell of this embodiment is explained. FIGS. 4A to 4F are cross sectional views showing the manufacturing steps of the manufacturing method. The feature of the manufacturing method of the DRAM memory cell of this embodiment is that the silicon nitride layer containing excessive Si is formed at low temperatures lower than 700° C. by use of a film formation method which is excellent in the controllability and coverage characteristic.

Figure 4A:
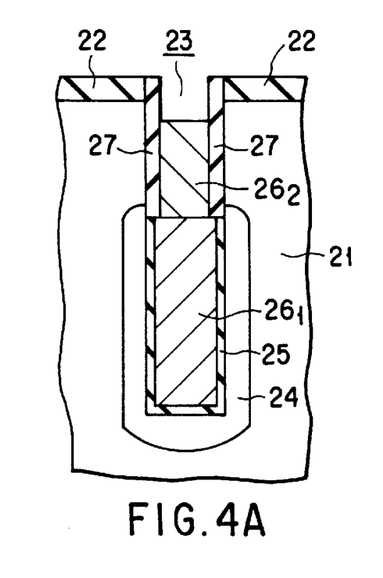
FIGS. 4A to 4F are cross sectional views showing the manufacturing steps of a manufacturing method of the DRAM memory cell of FIG. 3.

First, as shown in FIG. 4A, like the first embodiment, a mask pattern 22, trench 23, plate electrode 24, capacitor insulating film 25, first storage node electrode (first n-type polysilicon film) $26_1$, second storage node electrode (first n-type polysilicon film) $26_2$ and collar oxide film 27 are formed on the single crystal silicon substrate 21.

Figure 4B:
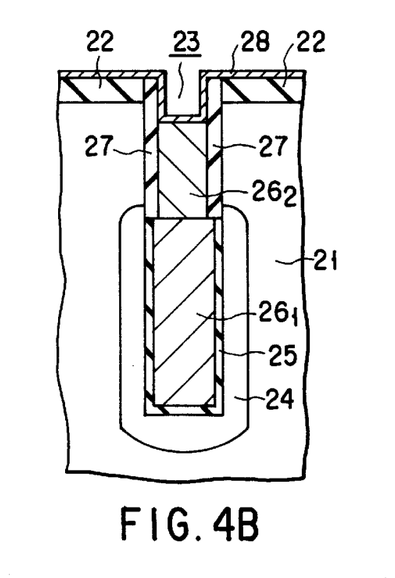

Next, as shown in FIG. 4B, the silicon nitride layer 28 containing excessive Si is formed on the entire surface of the resultant structure by the LPCVD method which is a film formation method excellent in the controllability and coverage characteristic.

In this case, the film formation temperature is set at 450° C., a raw material is hexachlorodisilane ($Si_2Cl_6$) and ammonium, the gas flow ratio $NH_3$/HCD is 1000/10 SCCM, and the film formation pressure is set at 1.4 Torr.

The film formation speed in this condition is set at 0.6 nm/min. It is preferable to set the thickness of the silicon nitride layer 28 containing excessive Si to approx. 3 nm or less although it depends on the electrical conductivity. In order to enhance the electrical conductivity of the silicon nitride layer 28, the flow rate of $Si_2Cl_6$ (which is hereinafter referred to as HCD) may be increased and the above gas flow ratio may be set to a smaller value.

By the above method, the silicon nitride layer 28 containing excessive Si can be easily formed on the side wall of the trench 23 of the single crystal silicon substrate 21 and on the surface of the second storage node electrode $26_2$ with the high controllability and coverage characteristic.

The silicon nitride layer 28 containing excessive Si on the surface of the second storage node electrode $26_2$ may be formed by a film formation method different from the film formation method of this embodiment. Further, the reason why the film formation temperature of the silicon nitride layer 28 containing excessive Si is set to 450° C. is to make the natural oxide film formed on the interface between the side wall of the trench 23 and the silicon nitride layer 28 containing excessive Si and the interface between the side wall of the trench 23 and the second storage node electrode $26_2$ as thin as possible. Only if it is desired to suppress diffusion of As, it is sufficient to set the film formation temperature to 700° C. or less.

Figure 5:
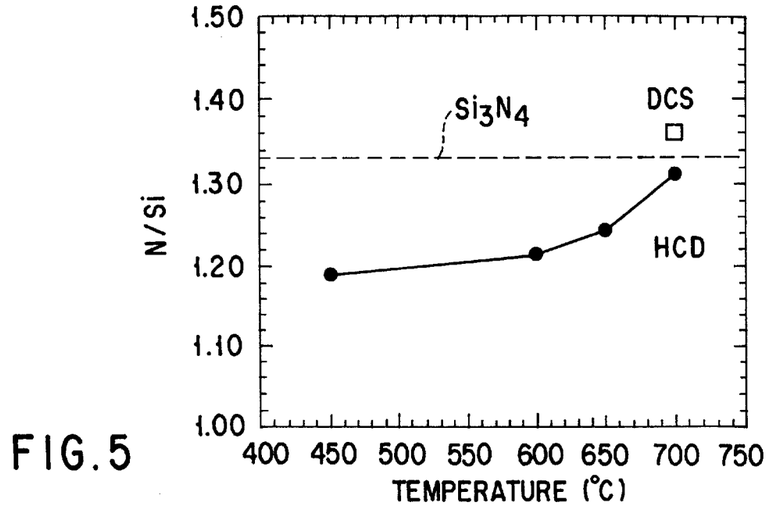
FIG. 5 is a diagram showing the relation between the N/Si ratio of a silicon nitride film formed by use of HCD and the film formation temperature.

FIG. 5 shows the relation between the N/Si ratio of the silicon nitride film (this invention) formed by use of HCD and the film formation temperature. The gas flow ratio $NH_3$/HCD is 100 for all of the silicon nitride films. For reference, the N/Si ratio of the silicon nitride film (prior art) formed at 700° C. by use of DCS(dichlorosilan:$SiH_2Cl_2$) is also shown. In this case, the gas flow ratio $NH_3$/HCD is 10. The N/Si ratio is derived based on the wet chemical analysis.

The stoichiometric composition (N/Si ratio) of the silicon nitride film ($Si_3N_4$) is 1.33. It is understood from FIG. 5 that the silicon nitride film whose stoichiometric composition is less than 1.33, that is, the silicon nitride film containing excessive Si can be formed by use of HCD. It is also understood from FIG. 5 that a silicon nitride film more excessively containing Si can be formed with the same flow ratio as the film formation temperature is lowered. Further, it is understood from FIG. 5 that a silicon nitride film which is rich in Si can be formed at 700° C. when HCD is used, but a silicon nitride film which is rich in Si cannot be formed when DCS is used.

Figure 6:
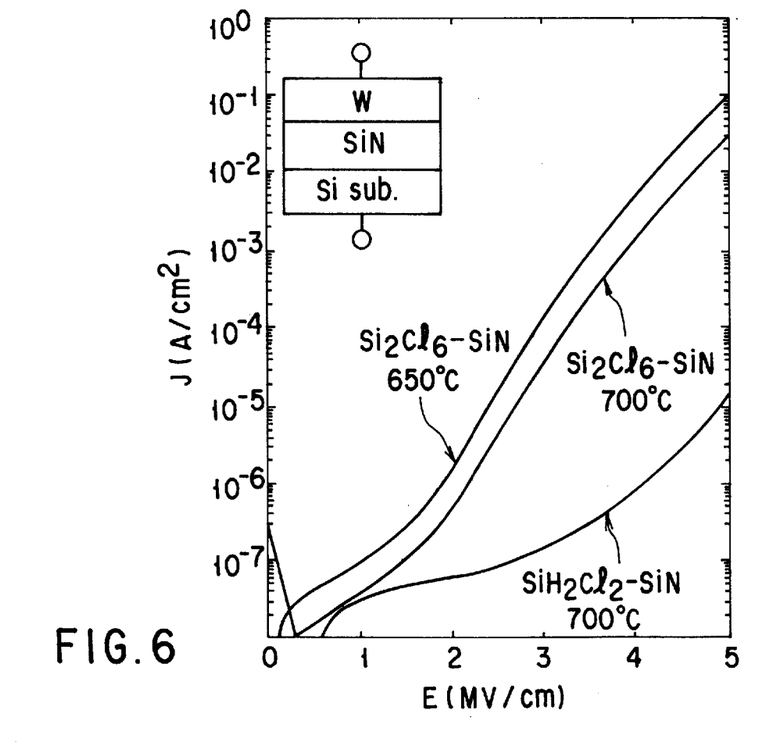
FIG. 6 is a characteristic diagram showing the result of checking a leak current flowing in the silicon nitride film formed by use of HCD.

FIG. 6 is a characteristic diagram showing the result of checking a leak current flowing in the silicon nitride film formed by use of HCD. In FIG. 6, the result of checking a leak current flowing in the silicon nitride film formed by use of $SiH_2Cl_6$ is also shown. As a sample, a structure of silicon substrate/silicon nitride film/tungsten electrode is used, an electric field E is applied to the sample, and the leak current is evaluated by measuring a current flowing between the silicon substrate and the tungsten electrode.

It is understood from FIG. 6 that the leak current can be increased by approx. two figures by lowering the film formation temperature when HCD is used. As described above, it becomes possible to easily form a silicon nitride film of low resistance containing excessive silicon by use of HCD.

Figure 4C:
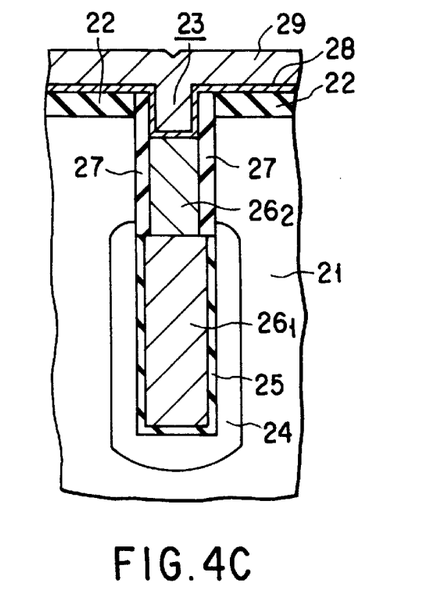

Next, as shown in FIG. 4C, a polysilicon film 29 is formed as a buried strap on the entire surface to fill the internal portion of the trench 23 by the normal LPCVD method. In this case, the silicon nitride layer 28 and polysilicon film 29 may be continuously formed by changing gases in the same furnace by use of HCD.

Figure 4D:
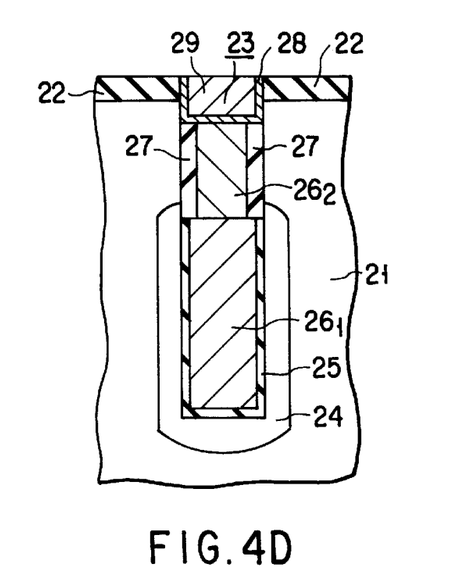

Then, as shown in FIG. 4D, a buried strap is formed by removing a portion of the silicon nitride layer 28 containing excessive Si and a surplus portion of the polysilicon film 29 which lie outside the trench 23 by use of the RIE method.

At this time, the silicon nitride layer 28 containing excessive Si and the polysilicon film 29 are removed to leave behind a shallow unfilled portion in the upper portion of the trench 23. In this case, the polysilicon film (buried strap) is formed from the beginning, but a polysilicon film can be formed by first forming an amorphous silicon film by the LPCVD method and then subjecting the amorphous silicon film to the heat treatment.

Figure 4E:
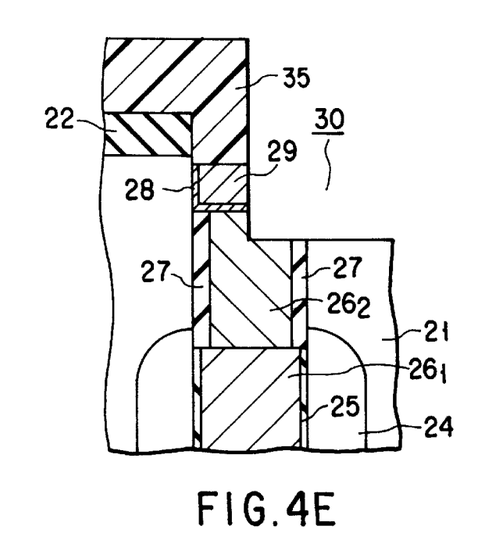

After this, as shown in FIG. 4E, a resist 35 for element isolation is formed and then the silicon nitride layer 28 containing excessive Si, buried strap 29, second storage node electrode $26_2$, collar oxide film 27 and single crystal silicon substrate 1 are processed by the RIE method with the above resist pattern used as a mask so as to form a shallow trench (element isolation trench) 30. After this, the mask pattern 22 and resist pattern 35 are removed.

Figure 4F:
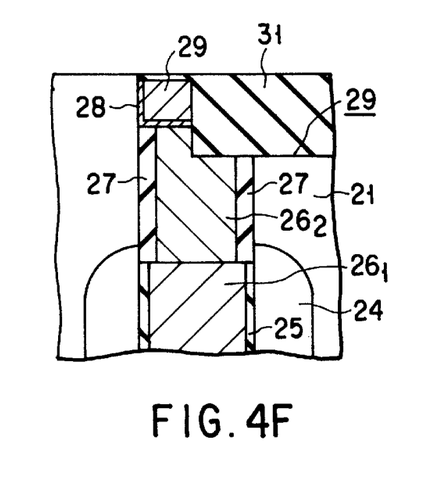

Next, as shown in FIG. 4F, an insulating film is deposited and the planarization process is effected by CMP so as to fill an element isolation insulating film 31 in the shallow element isolation trench.

The process for forming the element isolation insulating film 31 is accompanied by a step of high temperature, but the epitaxial growth from the side wall (single crystal silicon) of the trench to the buried strap (polysilicon film) can be suppressed by the presence of the silicon nitride layer 28 containing excessive Si and occurrence of transfer in the substrate can be prevented. Therefore, the data holding characteristic can be prevented from being deteriorated by an increase in the junction leak current due to occurrence of transfer.

Finally, a gate insulating film 32, gate electrode 33 and source/drain diffusion layers 34 are formed by the known method to complete the DRAM memory cell shown in FIG. 3. Although not shown in the drawing, it is preferable to form a shallow diffusion layer (extension) of low impurity concentration in order to suppress the short channel effect.

(Third Embodiment)

Figures 7A, 7B:
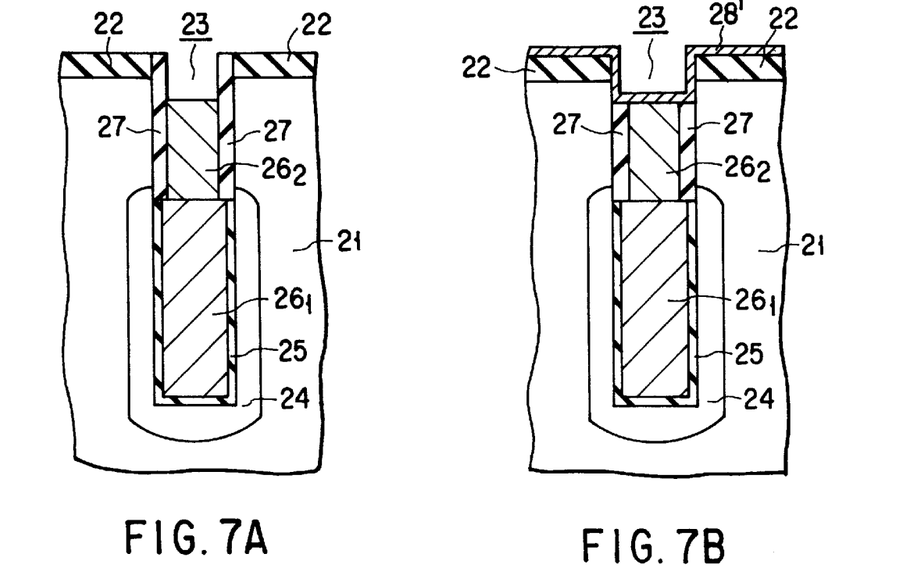
FIGS. 7A to 7C are cross sectional views showing the manufacturing steps of a manufacturing method of a DRAM memory cell according to a third embodiment.
Figure 7C:
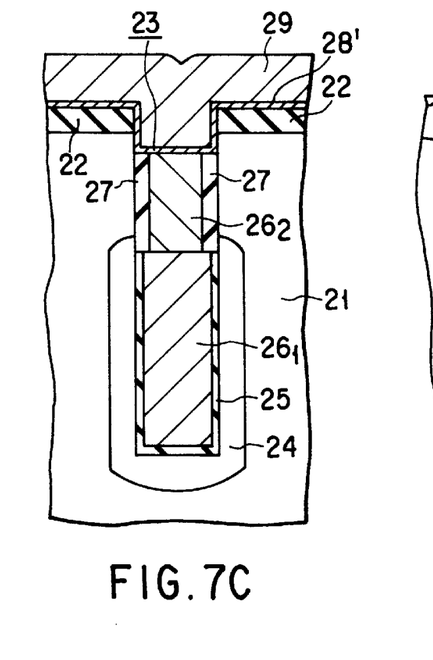

FIGS. 7A to 7C are cross sectional views showing the manufacturing steps of a manufacturing method of a DRAM memory cell according to a third embodiment of this invention. In this case, portions which correspond to those of FIGS. 4A to 4F are denoted by the same reference numerals and the detail explanation therefor is omitted. This embodiment is different from the second embodiment in the formation method of the interface layer (silicon nitride layer).

First, as shown in FIG. 7A, a single crystal silicon substrate, mask pattern, trench, plate electrode, capacitor insulating film, first and second storage node electrodes and collar oxide film are formed.

Next, after the natural oxide film is removed by a dilute HF process, the wafer is introduced into a furnace and subjected to the heat treatment of 600° C. and 0.3 Torr for one minute in an $SiCl_4$ atmosphere to cause the Si surface to adsorb $SiCl_4$. After $SiCl_4$ in the furnace is discharged, $SiCl_4$ adsorbed on the Si surface is subjected to the nitriding process (nitrified) in a condition of 600° C. and 0.3 Torr for one minute in an $NH_3$ atmosphere. Then, $NH_3$ in the furnace is discharged.

The process of adsorption of $SiCl_4$ and the nitriding process by use of $NH_3$ described above are repeatedly effected five times, and as shown in FIG. 7B, a silicon nitride layer 28' with a thickness of 0.4 nm is formed as an interface layer.

Next, as shown in FIG. 7C, an amorphous silicon film with a thickness of 250 nm is deposited to fill the internal portion of the trench. The process effected after this step is the same as the process effected after the step of FIG. 4D in the second embodiment.

The resistance of the silicon nitride layer 28' is lower than that of a silicon oxide layer with the same film thickness. The reason is as follows.

In the case of thermal nitriding process, oxygen which causes an increase in the resistance is introduced into the silicon nitride layer. On the other hand, since introduction of oxygen can be easily prevented in the method for forming the silicon nitride layer 28', an increase in the resistance of the silicon nitride layer 28' can be sufficiently prevented. Further, since the film formation temperature can be set low in the method for forming the silicon nitride layer 28', the growth of an oxide film can be sufficiently suppressed. This is also one of the reasons for sufficiently preventing an increase in the resistance of the silicon nitride layer 28'. Therefore, an increase in the contact resistance between the side wall of the trench 23 and the second storage node electrode $26_2$ can be suppressed.

Further, since the controllability of the thickness of the silicon nitride layer 28' is high in the method for forming the silicon nitride layer 28', the silicon nitride layer 28' which is thin can be easily formed and a variation in the thickness of the silicon nitride layer 28' can be suppressed to a sufficiently small value. It is important to make the silicon nitride layer 28' thin in order to reduce the resistance of the silicon nitride layer 28'.

In this case, the film formation temperature of the silicon nitride layer 28' is set at 600° C., but the film formation temperature is preferably set as low as possible. This is because impurity in the polysilicon film which is the second storage node electrode $26_2$ will be outwardly diffused and adsorb on the surface of the buried strap 29 if the film formation temperature is set at 700° C. or higher, and the adsorbed impurity is diffused towards the transistor in the post process to deteriorate the transistor characteristic. Another reason is that the substrate surface is oxidized by residual water before the silicon nitride layer 28' is formed if the film formation temperature is set high and consequently the contact resistance is increased. From the reasons described above, it is desirable to set the film formation temperature of the silicon nitride layer 28' to 700° C. or less or preferably 600° C. or less.

Further, if air is inserted into the furnace when the wafer is introduced into the furnace, the substrate surface is oxidized. Therefore, it is preferable to control the atmosphere when the wafer is introduced into the furnace so as to reduce the partial pressures of oxygen and water in the furnace as low as possible. More specifically, when the wafer is introduced into the furnace, the atmospheric air in the wafer introducing portion of the furnace is replaced by nitrogen or the wafer introducing portion is evacuated.

Further, setting of the temperature when the wafer is introduced into the furnace to a low temperature level is effective in suppressing oxidation of the surface of the buried strap 29 and it is preferable to set the wafer introducing temperature to 400° C. or less.

The function of the silicon nitride layer 28' as a barrier for preventing diffusion of impurity such as As, P is more effective than that of the silicon oxide layer. Therefore, the function of the silicon nitride layer 28' as a barrier for preventing impurity diffused into the second storage node electrode $26_2$ at high impurity concentration from being diffused towards the transistor is more effective than that of the silicon oxide layer.

This invention is not limited to the above embodiments. For example, in the above embodiment, a case wherein the epitaxial growth from the trench side surface of the trench capacitor to the buried strap 11 is suppressed is explained, but this invention is effective irrespective of the type of the element if the semiconductor device has a structure in which the side surface (single crystal semiconductor) of the trench is made in contact with the polycrystalline semiconductor film and which is exposed to a high temperature in the post process.

Further, in the above embodiment, a case wherein the polysilicon film is used as the buried strap is explained, but a polycrystalline Ge film or polycrystalline SiGe film can be used instead of the polysilicon film. In addition, this invention can be variously modified without departing from the technical scope thereof.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
   a single crystal semiconductor substrate;
   a polycrystalline semiconductor film formed on said single crystal semiconductor substrate; and
   a conductive interface layer formed between said single crystal semiconductor substrate and said polycrystalline semiconductor film and formed of a material different from constituent materials of said single crystal semiconductor substrate and said polycrystalline semiconductor film,
   wherein a trench is formed in a surface of said single crystal semiconductor substrate, said polycrystalline semiconductor film is formed in said trench, and said interface layer is formed between a side wall of said trench and said polycrystalline semiconductor film, and
   wherein said single crystal semiconductor substrate is formed of a single crystal silicon substrate, said polycrystalline semiconductor film is formed of a polysilicon film, and said interface layer is formed of a silicon nitride layer having a chlorine concentration of not less than $4 \times 10^{20}$ cm$^{-3}$.

2. A semiconductor device comprising:
   a single crystal semiconductor substrate;
   a polycrystalline semiconductor film formed on said single crystal semiconductor substrate; and
   a conductive interface layer formed between said single crystal semiconductor substrate and said polycrystalline semiconductor film and formed of a material different from constituent materials of said single crystal semiconductor substrate and said polycrystalline semiconductor film,
   wherein a trench is formed in a surface of said single crystal semiconductor substrate, said polycrystalline semiconductor film is formed in said trench, and said interface layer is formed between a side wall of said trench and said polycrystalline semiconductor film, and
   wherein said single crystal semiconductor substrate is formed of a single crystal silicon substrate, said polycrystalline semiconductor film is formed of a polysilicon film, and said interface layer is formed of a silicon nitride layer having an S/N ratio of not larger than 1.24 and a chlorine concentration of not less than $4 \times 10^{20}$ cm$^{-3}$.

* * * * *